United States Patent [19]

Ipri et al.

[11] 3,974,515
[45] Aug. 10, 1976

[54] IGFET ON AN INSULATING SUBSTRATE
[75] Inventors: Alfred Charles Ipri, Belle Mead; Joseph Hurlong Scott, Plainsboro; John Carl Sarace, Plainfield, all of N.J.
[73] Assignee: RCA Corporation, New York, N.Y.
[22] Filed: Sept. 12, 1974
[21] Appl. No.: 505,584

[52] U.S. Cl. .................................. 357/23; 357/4; 357/55; 357/49
[51] Int. Cl.[2] ................. H01L 29/78; H01L 27/12; H01L 45/00; H01L 29/06
[58] Field of Search ..................... 357/4, 23, 49, 55

[56] References Cited
UNITED STATES PATENTS
3,191,061   6/1965   Weimer .............................. 357/4
3,890,632   6/1975   Ham et al. ......................... 357/23

OTHER PUBLICATIONS
IBM Tech. Bul. –vol. 16, No. 3, Aug. 1973 – Abbas et al, "Silicon on Sapphire on Silicon..."

Primary Examiner—Edward J. Wojciechowicz
Attorney, Agent, or Firm—H. Christoffersen; Robert P. Williams; Thomas H. Magee

[57] ABSTRACT

The breakdown voltage of a novel insulated gate field effect transistor (IGFET), comprising silicon on sapphire (SOS), is substantially doubled by a novel structure wherein a dielectric layer, formed over a channel region of the IGFET, also extends continuously over the surface of the sapphire on opposite sides of the channel region. A polysilicon gate electrode is disposed over the dielectric layer, the gate electrode extending beyond the channel region and being separated from the sapphire substrate by the dielectric layer. The novel method of making the IGFET comprises providing an island of epitaxially deposited doped silicon on the sapphire substrate, and dielectric layer extending continuously over both the island and over portions of the substrate on opposite sides of the island.

9 Claims, 17 Drawing Figures

PRIOR-ART

IGFET ON AN INSULATING SUBSTRATE

This invention relates to a novel insulated gate field effect transistor (IGFET) and to a method of making it. The novel IGFET and method of making it are particularly useful in the manufacture of silicon on sapphire (SOS) complementary transistors employed in many types of semiconductor circuits.

We have observed that there have been premature failure (breakdowns) in the gate dielectrics of prior-art SOS/IGFETs when a bias in excess of about 36 volts has been applied between the gate electrode and the source-drain regions. This breakdown appears to be associated with the polysilicon-silicon oxide-silicon-sapphire interface in the IGFET. The Achilles heel, the weakest point of the prior art SOS/IGFET technology, appears to be at the opposite edges of a silicon island, comprising the channel region of the IGFET, particularly where the edges of the channel region meet the sapphire substrate surface.

The novel SOS/IGFET and method of making it substantially overcome the aforementioned problem and provide an SOS/IGFET whose breakdown voltage is about twice that of prior-art SOS/IGFETs.

Briefly stated, the novel IGFET comprises an island of doped single-crystal silicon on a portion of a surface of an electrically insulating substrate. A dielectric layer is over a channel region of the IGFET and is also continuous over the surface of the substrate, extending away from opposite sides of the channel region. A gate electrode is disposed over the dielectric layer, extending beyond the channel region, and being separated from the insulating substrate by the dielectric layer. The dielectric layer may comprise silicon oxide, silicon nitride, aluminum oxide, or combinations thereof.

The novel method of making the novel IGFET comprises the operation of providing an island of epitaxially deposited doped silicon on an electrically insulating substrate, and a dielectric layer over both the island and portions of the substrate, extending away from opposite sides of the island.

In one embodiment of the novel method, the aforementioned operation is carried out by depositing a layer of doped silicon epitaxially on the insulating substrate, etching the silicon layer so as to produce an island, depositing a thin layer of single-crystal or polycrystalline silicon over the silicon island and also over the insulating substrate, and then completely oxidizing the last-mentioned thin silicon layer to form a dielectric layer of silicon oxide.

In another embodiment of the novel method, the aforementioned operation is carried out by depositing a layer of doped silicon epitaxially on an electrically insulating substrate, selectively etching the silicon layer to form a mesa surrounded by a thin portion of the doped silicon, and oxidizing both the mesa and the thin portion of surrounding silicon until the thin portion is completely oxidized to form a dielectric layer of silicon oxide over an island of silicon and extending over the substrate.

In still another embodiment of the novel method, the operation of providing an island of epitaxially deposited doped silicon on an electrically insulated substrate, and a dielectric layer over both the island and portions of the substrate is carried out by forming the island of silicon, as described above, and then depositing a dielectric layer of silicon nitride aluminum oxide, or silicon oxide, for example, over both the island of silicon and the substrate. The dielectric layer may be a composite of one of the aforementioned materials and a layer of silicon oxide formed from the oxidation of the surface of the silicon island.

The novel IGFET and method of making it will be described in conjunction with the following drawings in which.

Figure 8:
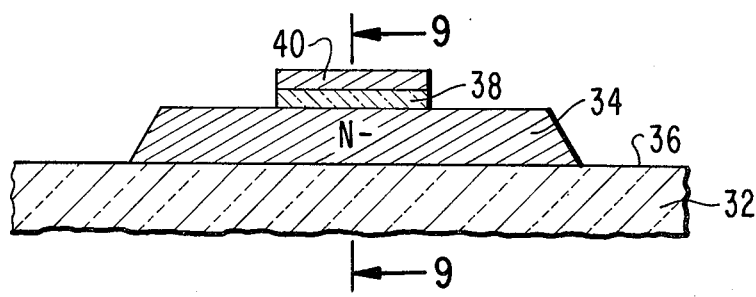
Figure 9:
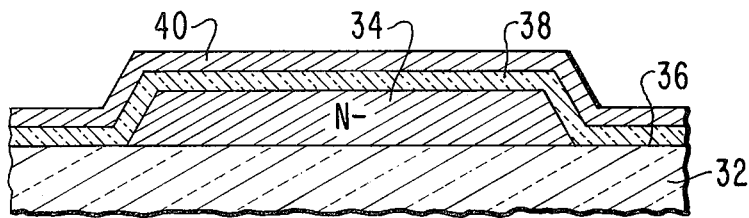
Figure 12:
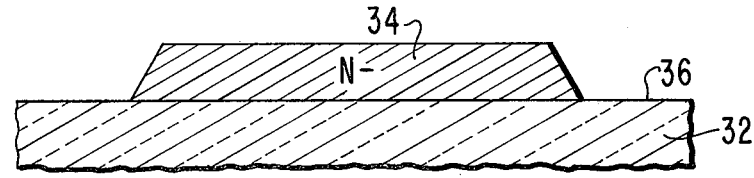
Figure 13:
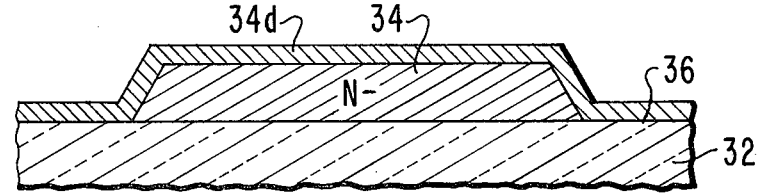
Figure 14:
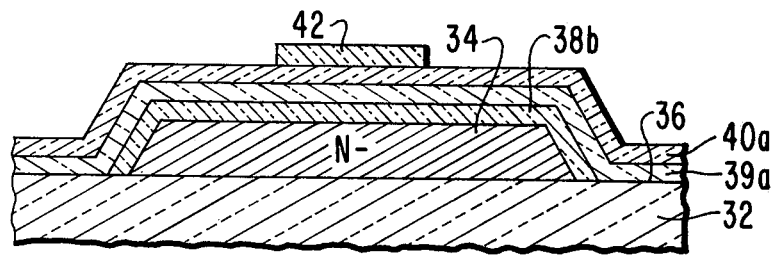
Figure 15:
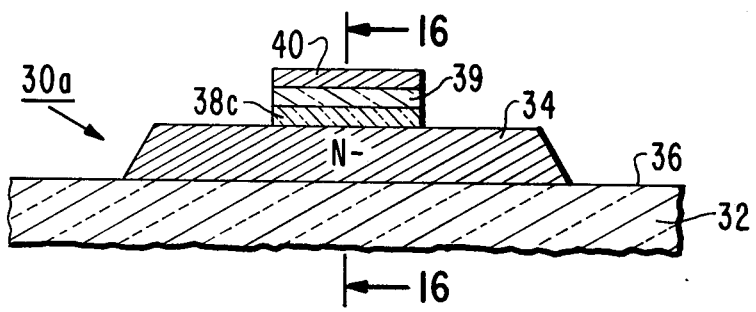
Figure 16:
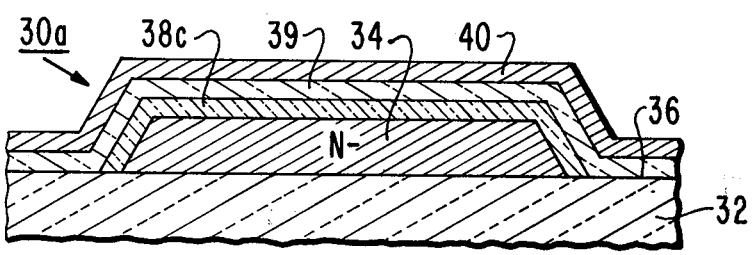
Figure 17:
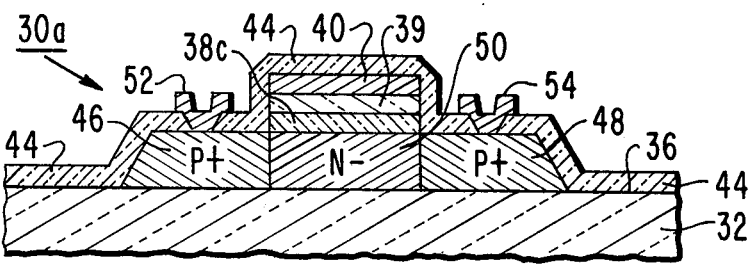

FIGS. 3-8, and 10, and 11 are cross-sectional drawings of the novel IGFET, illustrating different operations in its manufacture in one embodiment of the novel IGFET;

FIG. 9 is a cross-sectional drawing, taken along the plane 9—9 in FIG. 8, through a portion of the IGFET 30 that is to be the channel region thereof;

FIGS. 12 and 13 are cross-sectional drawings of the novel IGFET in different operations of its manufacture in another embodiment of the novel method;

FIGS. 14, 15 and 17 are cross-sectional drawings of the novel IGFET in different operations of its manufacture in still another embodiment of the novel method; and FIG. 16 is a cross-sectional drawing, taken along the plane 16—16 in FIG. 15, through a portion of the IGFET 30a that is to be the channel region thereof.

Similar reference numerals and characters used herein in different drawings refer to similar parts.

Figure 1:
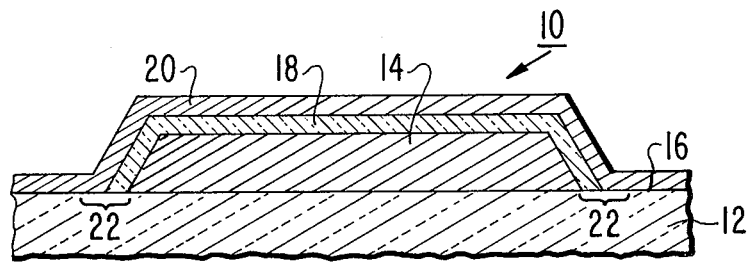
FIG. 1 is a cross-sectional drawing of an IGFET of the prior art, the cross section being taken through the channel region.

Referring now to FIG. 1 of the drawing, there is shown a prior-art IGFET 10 of the type that presents a problem of premature breakdown of the dielectric layer (silicon oxide) when a bias voltage in excess of 36 volts is applied between the gate electrode and the source-drain regions. The IGFET 10 comprises an electrically insulating substrate 12, such as of sapphire or spinel, an island 14 of single-crystal N- doped silicon on a surface 16 of the substrate 12, a silicon oxide layer 18, comprising the gate dielectric over the silicon island 14, and a gate electrode 20, such as of doped polysilicon over the silicon oxide layer 18. The aforementioned premature breakdown in the prior-art IGFET 10 appears to be associated with the polysilicon-silicon oxide-silicon-sapphire interface 22.

Figure 2:
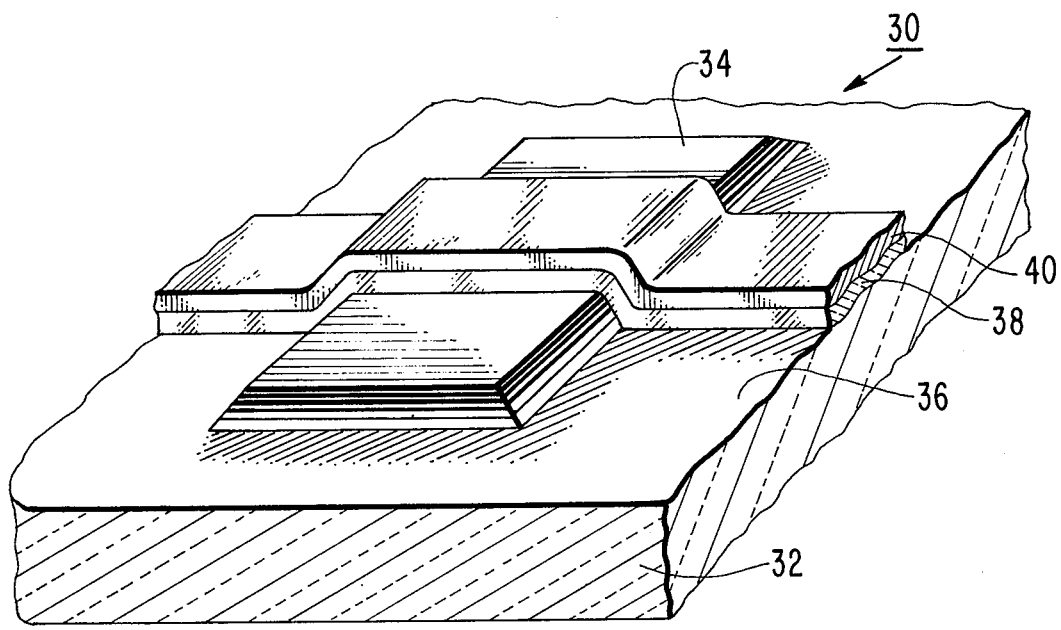
FIG. 2 is a perspective drawing of an embodiment of the novel IGFET, viewed from above and the right thereof, showing the IGFET without a passivating layer thereover.

In accordance with the present invention, the structure of one embodiment of the novel IGFET 30, shown in FIG. 2, overcomes the problem presented by the interface 22 (FIG. 1) by providing a structure that eliminates this interface 22. Referring now to FIG. 2, the IGFET 30 is shown comprising an electrically insulating substrate 32, such as of sapphire of spinel, having a single-crystal silicon island 34 on a surface 36 of the substrate 32. A dielectric layer 38 of silicon oxide is formed over a portion of the island 34 which is the channel region of the IGFET 30 and extends over both the silicon island 34 and the portions of the surface 36 of the substrate 32 extending away from opposite sides of the island 34 and channel region disposed therein, the opposite sides being along the same direction as the flow of conductivity modifiers in the channel region. A polysilicon gate electrode 40 is deposited over the dielectric layer 38, extends away from the opposite sides of the silicon island 34, and is separated from the surface 36 of the substrate 32 by the dielectric layer 38. Thus, the IGFET 30 does not provide an interface between the gate electrode 40 and the surface 36 of the substrate 32 adjacent the edge of the silicon island 34; but it does provide a structure wherein the breakdown voltage of the IGFET 30 is substantially twice that of the IGFET 10 of the prior art.

Figure 3:
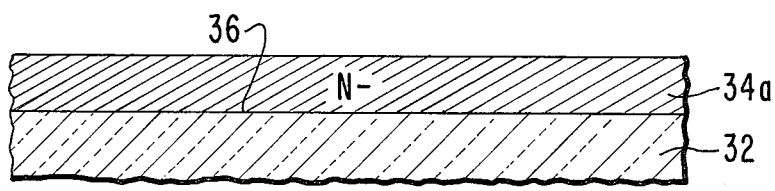

One embodiment of the novel method of making the novel IGFET 30 will be described and illustrated by FIGS. 3–11. Referring now to FIG. 3, there is shown the substrate 32 with a layer 34a of single-crystal N-doped silicon deposited on the surface 36 of the substrate 32. The substrate 32 can have a thickness of between about 0.025 and 0.050 cm. The silicon layer 34a can have a carrier concentration, for example, of between about 1–2 ×10$^{15}$ arsenic atoms/cm$^3$ and a thickness of between 0.6 and 0.8 μm. The silicon layer 34a is preferably deposited on the (1102) plane of sapphire by any process well known in the semiconductor art. For example, the silicon layer 34a may be deposited epitaxially on the surface 36 by the pyrolysis of silane (SiH$_4$).

The epitaxial silicon layer 34a is now defined as a substantially rectangular mesa 34b (FIG. 4) surrounded by a thin portion 34c of the silicon layer 34a by photolithographic means, employing a suitable photoresist and etchants well known in the semiconductor processing art. The thickness of the thin portion 34c of silicon is between 50 and 500A, preferably between 100 and 300A. In forming the mesa 34b and the surrounding thin portion 36c of silicon from the silicon layer 34a (FIG. 3), portions of the silicon layer 34a are etched away until the outer edges of the thin portion 34c are almost completely etched away. Under these conditions, the portion 34c adjacent the mesa 34b will usually have a thickness of between about 100 and 300A. The exact thickness of the thin portion 34c of silicon should be determined by conventional measuring means well known in the art.

Figure 4:
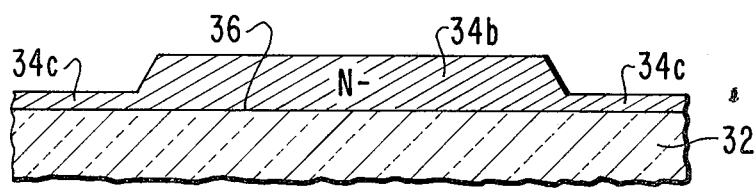
Figure 5:
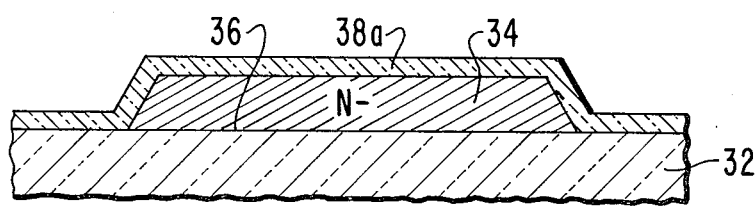

The silicon structure of FIG. 4, comprising the thin portion 34c and the mesa 34b, is now oxidized, as by heating in steam containing HCl at a temperature of about 900°C for 50 minutes, to completely oxidize the thin portion 34c and to form a dielectric layer 38a of silicon oxide (FIG. 5) over the silicon island 34. An important feature of the novel IGFET 30 is the fact that the dielectric layer 38a extends over both the silicon island 34 and the surface 36 of the substrate 32, away from opposite sides of the silicon island 34, as shown in FIG. 5. A portion of the dielectric layer 38a will form the gate dielectric 38 of the novel IGFET 30. The dielectric layer 38a comprises substantially silicon dioxide.

Figure 6:
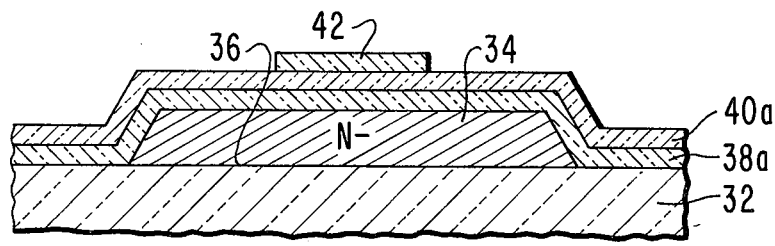
Figure 7:
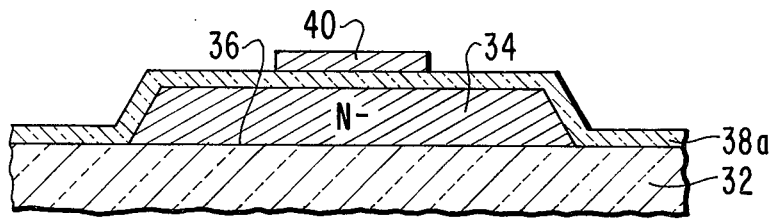

A layer 40a polysilicon is deposited over the dielectric layer 38a to a thickness of about 0.5 μm by deposition means well known in the art. The polysilicon layer 40a, shown in FIG. 6, is undoped at this stage in the manufacture of the IGFET 30. A strip 42 of boron glass is deposited over the polysilicon layer 40a and structured, by well-known photolithographic means, as with a suitable photoresist and an etchant of buffer hydrofluoric acid, for example, to have the general shape of the (gate electrode) polysilicon layer 40 shown in FIG. 2.

Boron from the structured boron glass strip 42 is now diffused into the polysilicon layer 40a by heating the structure of FIG. 6 at a temperature of about 1050°C for about 15 minutes in a helium ambient. After this diffusion, the boron glass strip 42 is etched away, using pure hydrofluoric acid (which does not attack the polysilicon layer 40a). Next, the polysilicon layer 40a is etched with an anisotropic etchant of KOH, alcohol, and water to etch away all of the polysilicon layer 40a except for the polysilicon layer 40, shown in FIGS. 7 and 2, that was doped with boron from the structured boron glass strip 42. The anisotropic etchant provides sloped edges of the polysilicon layer 40.

Portions of the dielectric layer 38a, except for the (silicon oxide) dielectric layer 38 (FIGS. 8 and 2) directly beneath the polysilicon layer 40, are now etched with a buffered hydrofluoric acid etchant to expose areas of the upper surface of the silicon island 34 for diffusing dopants therein to form source and drain regions.

FIG. 9 is a cross-sectional view through the central portion of the IGFET structure, that is, through what is to be the channel region of the novel IGFET 30. FIGS. 8 and 9 are cross-sectional views of the novel IGFET, without a passivating layer thereon, as illustrated also as in the perspective view of FIG. 2.

Figure 10:
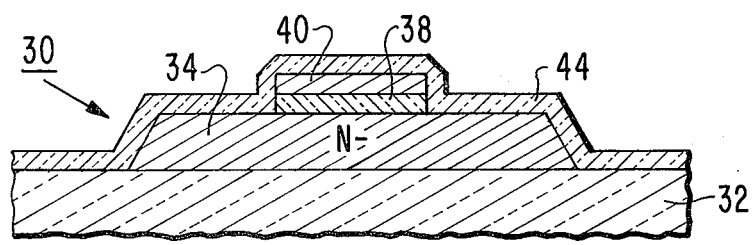
Figure 11:
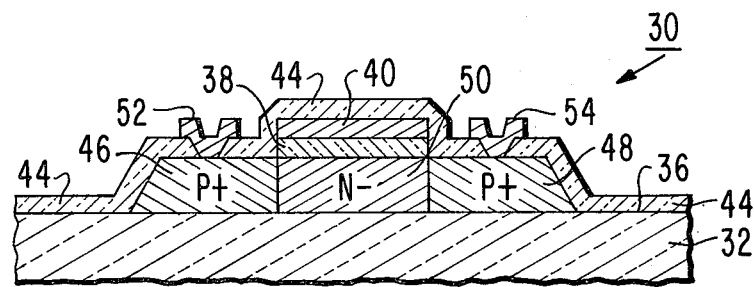

Means are now provided to form the source and drain regions of the novel IGFET 30. To this end, a glass layer 44 of P+ doped glass, such as boron glass, for example, is deposited over the surface 36 of the substrate 32, over the exposed portions of the silicon island 34, and over the polysilicon layer 40, as shown in FIG. 10, by any suitable means known in the semiconductor art. The P+ dopant from the glass layer 44 is now diffused into the contiguous portions of the silicon island 34 to form source and drain regions 46 and 48, respectively, as shown in FIG. 11. This diffusion is carried out by heating the structure, shown in FIG. 10, at about 1050°C for about 15 minutes in a helium ambient. The region of the silicon island 34, between the source and drain regions 46 and 48, is channel region 50 of the novel IGFET 30, the channel region 50 being substantially beneath the (silicon oxide) dielectric layer 38 and the polysilicon layer 40 (gate electrode).

Contact openings are now formed in the glass layer 44, above the source and drain regions 46 and 48 for metal (aluminum) contacts 52 and 54, respectively, to these regions. An opening (not shown) in the glass layer 44 for an electrical contact to the (gate electrode) polysilicon layer 40 is also made. The glass layer 44 in addition to its function as a dopant source, also functions as a passivating layer of the novel IGFET 30.

In operation, we have observed that the breakdown voltage for the IGFET 30, illustrated in FIG. 11, is substantially twice that of the prior-art IGFET 10, illustrated in FIG. 1. The reason for this improved operating characteristic is due, at least in part, to the fact that the IGFET 30 has a structure wherein the gate dielectric, that is the silicon oxide dielectric layer 38 is formed over both the island 34 and the surface 36 of the substrate 32, as shown best in FIGS. 2 and 9; and the gate electrode, that is, the polysilicon layer 40 is coextensive with the dielectric layer 38, thereby eliminating the aforementioned weakness of the polysilicon-silicon oxide-silicon-sapphire interface 22 (FIG. 1) of the prior-art IGFET 10.

In the aforementioned novel method of making the novel IGFET 30, the partial etch of, and mesa formation from, the epitaxial silicon layer 34a, shown in FIG. 4, is exacting and time consuming because of the necessity of etching the thin portion 34c uniformly to a thickness approximately between 100 and 300A. This operation usually requires close observation and testing. The partial etching operation is obviated in another embodiment of the novel method illustrated in FIGS. 12 and 13. Thus, after the silicon layer 34 a is deposited on the surface 36 of the substrate 32, as shown in FIG. 3, the silicon layer 34a is etched, by photolithographic means well known in the art, to form the rectangular silicon island 34, as shown in FIG. 12. Next, a layer 34d of epitaxial single-crystal or polycrystalline silicon is deposited over the silicon island 34 and over the surface 36 of the substrate 32 to a thickness of between 50 and 500A, preferably between 100 and 300A.

The structure of FIG. 13 is now oxidized in steam, containing HCl, at a temperature of about 900°C for about 15 minutes until the silicon layer 34d is completely oxidized to silicon oxide, mostly silicon dioxide. When the structure of FIG. 13 is so oxidized, it assumes the structure previously described for FIG. 5, the oxidized layer now being the silicon oxide dielectric layer 38a of FIG. 5. The manufacture of the novel IGFET 30 (FIG. 11) from this point on is the same as previously described for FIGS. 5–11.

Referring now to FIGS. 15, 16 and 17 of the drawings, there is shown an IGFET 30a, another embodiment of the invention. The IGFET 30a is similar to the IGFET 30, shown in FIGS. 9, 10 and 11, except for the gate dielectric. In the IGFET 30a, the gate dielectric comprises a dielectric layer 39 of an insulating material other than thermally grown silicon oxide, such as silicon nitride ($Si_3N_4$), aluminum oxide ($Al_2O_3$), or vapor-deposited silicon oxide, for example. The gate dielectric of the IGFET 30a can preferably be a composite of two layers of electrically insulating material, such as the dielectric layer 39 and a dielectric layer 38c (FIG. 17) of silicon dioxide. Hence, in the IGFET 30a, the polysilicon layer 40 gate electrode extends from opposite sides of the silicon island 34 and is separated from the surface 36 of the substrate 32 by the dielectric layer 39 of silicon nitride or aluminum oxide, as shown in FIG. 16. The dielectric layer 38c, in FIGS. 15, 16 and 17, extends only over the channel region 50 of the IGFET 30a. While the IGFET 30a is operable without the dielectric layer 38c, of silicon oxide, it forms a preferable composite dielectric layer with the dielectric layer 39.

The embodiment of the novel method of making the novel IGFET 30a will be described with the aid of the FIGS. 3, 12, 14, 15, 16, and 17. The silicon island 34 (FIG. 12) on the surface 36 of the substrate 32 is provided by defining the epitaxially deposited silicon layer 34a (FIG. 3) as described supra. A dielectric layer 38b (FIG. 14) is grown over the exposed surface of the silicon island 34, as by heating the silicon island 34 in steam, containing HCl, at a temperature of about 900°C for about 50 minutes. The thickness of the dielectric layer 38b may range from between about 20 and 900A.

Next, a dielectric layer 39a (FIG. 14) of silicon nitride, aluminum oxide, or vapor-deposited silicon oxide is deposited over the dielectric layer 38b to form a composite dielectric layer therewith. Silicon nitride can be deposited from the reaction of silane ($SiH_4$) and ammonia ($NH_3$) at a temperature of about 900°C in a hydrogen ($H_2$) ambient. Aluminum oxide, if desired for the dielectric layer 39a, can be deposited by first depositing a layer of aluminum and then oxidizing the aluminum, as by anodic oxidation, in a manner well known in the art. Vapor deposited silicon oxide can be deposited from the reaction of silane and oxygen in neutral ($N_2$) ambient at about 400°C. The thickness of the dielectric layer 39a can be between about 100 and 1000A.

The polysilicon layer 40a (FIG. 14) is now deposited over the dielectric layer 39a and doped by diffusion from the structured boron glass strip 42 (FIG. 14) in the same manner described previously for forming the gate electrode, polysilicon layer 40, for the IGFET 30.

The doped polysilicon layer 40a (FIG. 14) is now etched with an anisotropic etchant of KOH, alcohol, and water to form the structured polysilicon layer 40 (of the shape shown in FIG. 2), that is, over what is to be the channel region 50 (FIG. 17), of the IGFET 30a. Using the polysilicon layer 40 as a mask, the dielectric layers 39a and 38b are etched to the shape illustrated in FIGS. 15, 16 and 17. When the dielectric layer 30a is of silicon nitride or aluminum oxide, it is etched with hot phosphoric acid to form the dielectric layer 39 (FIGS. 15 and 16). The dielectric layer 38b of silicon oxide is etched with buffered HF to form the dielectric layer 38c (FIGS. 15 and 16).

The structure of the IGFET 30a thus far completed, as shown in FIGS. 15 and 16, is now covered with the P+ doped layer 44, as shown in FIG. 17, in the same manner as described previously with respect to FIGS. 10 and 11 supra. From this point on the formation of the source region 46, drain region 48, and channel region 50 and contacts 52 and 54 to the source and drain regions, respectively, for the IGFET 30a is substantially the same as described previously for the IGFET 30.

While the embodiments of the novel IGFETs 30 and 30a have been described as having a doped polysilicon gate electrode doped polysilicon (layer 40), it is within the contemplation of the present invention to provide the IGFETs 30 and 30a with a metal (gate) electrode, such as of aluminum, molybdenum, tungsten, or alloys thereof, for example, in place of the doped polysilicon gate electrode, in a manner well known in the art. Gate electrodes of doped polysilicon (layer 40) for the IGFETs 30 and 30a are preferred to metal gate electrodes because the former provide the IGFETs with better performance, higher speed of operation, and a lower level of power dissipation.

What is claimed is:
1. An IGFET comprising:
   an electrically insulating substrate having a surface,
   an island of single-crystal silicon on a portion of said surface, having source and drain regions of one type conductivity at opposite ends thereof, respectively, and having a channel region of the opposite type conductivity intermediate said source and drain regions and adjacent to the surface of said island away from said substrate,
   a dielectric layer over said channel region and continuous over said surface of said substrate on opposite sides of said channel region and extending away therefrom, said opposite sides being along the same direction as the flow of conductivity modifiers in said channel region, and
   a gate electrode over said dielectric layer, said gate electrode extending beyond said channel region away from said opposite sides and being separated from said substrate by said dielectric layer.
2. An IGFET as defined in claim 1, wherein:

said electrically insulating substrate is an electrical insulator chosen from the group consisting of sapphire and spinel, and said dielectric layer comprises silicon oxide.

3. An IGFET as defined in claim 1, wherein:

said dielectric layer comprises the reaction product of the oxidation of silicon that has been deposited on said substrate, and said gate electrode is a metal chosen from the group consisting of aluminum, molybdenum, tungsten, and alloys thereof.

4. An IGFET as defined in claim 1, wherein:

said gate electrode comprises doped polysilicon.

5. An IGFET as defined in claim 4, wherein:

a passivating layer, comprising dopant means for said gate electrode, is deposited over said gate electrode and said island.

6. An IGFET as defined in claim 1, wherein:

said dielectric layer comprises silicon nitride.

7. An IGFET as defined in claim 1, wherein:

said dielectric layer comprises aluminum oxide.

8. An IGFET as defined in claim 1, wherein:

said dielectric layer comprises vapor-deposited silicon oxide.

9. An IGFET as defined in claim 1, wherein:

said dielectric layer is a composite of a layer of thermally grown silicon oxide and a layer of a dielectric material chosen from the group consisting of vapor-deposited silicon oxide, silicon nitride, and aluminum oxide.

* * * * *